United States Patent
Oeguen et al.

(10) Patent No.: US 11,791,424 B2
(45) Date of Patent: Oct. 17, 2023

(54) DEVICE INCLUDING PHOTOCONDUCTOR READOUT CIRCUIT FOR MEASURING DIFFERENTIAL VOLTAGES OF A PHOTOCONDUCTOR

(71) Applicant: trinamix GmbH, Ludwigshafen am Rhein (DE)

(72) Inventors: Celal Mohan Oeguen, Ludwigshafen (DE); Bernd Scherwath, Ludwigshafen (DE); Peter Fejes, Ludwigshafen (DE); Felix Berno Mueller, Ludwigshafen (DE)

(73) Assignee: trinamiX GmbH

( * ) Notice: Subject to any disclaimer, the term of this patent is extended or adjusted under 35 U.S.C. 154(b) by 0 days.

(21) Appl. No.: 17/759,338

(22) PCT Filed: Jan. 29, 2021

(86) PCT No.: PCT/EP2021/052081
§ 371 (c)(1),
(2) Date: Jul. 22, 2022

(87) PCT Pub. No.: WO2021/152074
PCT Pub. Date: Aug. 5, 2021

(65) Prior Publication Data
US 2023/0039433 A1    Feb. 9, 2023

(30) Foreign Application Priority Data
Jan. 30, 2020   (EP) ..................................... 20154495

(51) Int. Cl.
*H01L 31/02*   (2006.01)
*H01L 31/09*   (2006.01)
*G01J 1/44*    (2006.01)

(52) U.S. Cl.
CPC .......... *H01L 31/02016* (2013.01); *G01J 1/44* (2013.01); *H01L 31/09* (2013.01); *G01J 2001/4446* (2013.01)

(58) Field of Classification Search
CPC ...... H01L 31/02016; H01L 31/09; G01J 1/44; G01J 2001/4446
See application file for complete search history.

(56) References Cited

U.S. PATENT DOCUMENTS 3,450,969 A * 6/1969 Nakatani ................ G03B 7/085
                                                      318/681
3,590,251 A    6/1971 Vosteen
(Continued)

FOREIGN PATENT DOCUMENTS

CN    208077480 U    11/2018
EP    3312576 A1    4/2018
(Continued)

OTHER PUBLICATIONS

Anonymous, "555 timer IC—Wikipedia", Oct. 2, 2019 (Oct. 2, 2019), URL:https://en.wikipedia.org/w/index.php?title=555_timer_IC&oldid=919149415. [retrieved on Jul. 19, 2022].
(Continued)

*Primary Examiner* — Jennifer D Bennett
*Assistant Examiner* — Erin R Garber
(74) *Attorney, Agent, or Firm* — Armstrong Teasdale LLP (57) ABSTRACT

A device includes at least one photoconductor configured for exhibiting an electrical resistance $R_{photo}$ dependent on an illumination of a light-sensitive region of the at least one photoconductor and at least one photoconductor readout circuit. The photoconductor readout circuit is configured for determining a differential voltage related to changes of the electrical resistance $R_{photo}$ of the photoconductor. The photoconductor readout circuit includes at least one bias voltage
(Continued)

source configured for applying at least one periodically modulated bias voltage to the photoconductor such that the electric output changes its polarity at least once. The device further includes at least one electrical circuit configured to balance the differential voltage at a given illumination level.

11 Claims, 5 Drawing Sheets

(56) References Cited

U.S. PATENT DOCUMENTS

| | | | |
|---|---|---|---|
| 3,974,426 A * | 8/1976 | Gingras | G05B 11/32 327/512 |
| 5,575,284 A | 11/1996 | Athan et al. | |
| 6,028,312 A | 2/2000 | Wadsworth et al. | |
| 2016/0365435 A1* | 12/2016 | Then | H01L 29/66462 |
| 2018/0356501 A1* | 12/2018 | Send | G01S 11/12 |

FOREIGN PATENT DOCUMENTS

| | | | |
|---|---|---|---|
| SU | 1714403 A1 * | 2/1992 | |
| TW | I398592 B * | 6/2013 | |
| WO | 2012110924 A1 | 8/2012 | |
| WO | 2014097181 A1 | 6/2014 | |
| WO | 2016120392 A1 | 8/2016 | |

OTHER PUBLICATIONS

International Search Report and Written Opinion for corresponding PCT/EP2021/052081 dated Apr. 9, 2021; 11 pages.

* cited by examiner

DEVICE INCLUDING PHOTOCONDUCTOR READOUT CIRCUIT FOR MEASURING DIFFERENTIAL VOLTAGES OF A PHOTOCONDUCTOR

CROSS-REFERENCE TO RELATED APPLICATIONS

This application is a U.S. National Phase Application of International Patent Application No. PCT/EP2021/052081, filed Jan. 29, 2021, which claims priority to European Patent Application No. 20154495.4, filed Jan. 30, 2020, each of which is hereby incorporated by reference herein.

FIELD OF THE INVENTION

The invention relates to a photoconductor readout circuit, a detector and use of a photoconductor readout circuit for readout of photoconductors. Specifically, the photoconductor readout circuit may be used to determine a measurable voltage response of photoconductors such as of lead sulfide photoconductors sensors.

PRIOR ART

Photoconductors are sensors, which require an external excitation signal to generate an electrical output depending on the measured physical quantity. In the case of photoconductors this physical quantity is illumination. Most commonly, a voltage $V_{Bias}$ is applied to the photoconductors as excitation signal.

The photoconductors change their resistance depending on the illumination. The change itself is relatively small compared to the total resistance value of the photoconductor. As an example, a PbS-detector with dimension of 2 mm×2 mm featuring a resistance of about 1 MΩ changes its resistance due to infrared radiation at 1550 nm with an irradiance of 16 μW/cm2 about 10 kΩ, which corresponds 1% change. Thus, the excitation signal is orders of magnitude greater than the electrical output change due to the illumination. Without any filtering, the read-out electronics should be able to measure the whole signal but still solve the change of 1% with a relatively good resolution. Such read-out electronics are commercially available, yet very expensive.

Photoconductors as well as other types of resistors like carbon composite or thick film resistors exhibit a strong 1/f noise, also known as flicker noise, which is dominant at smaller frequencies. 1/f noise strongly depends on the DC part of the current $I_{DC}$, flowing through the photoconductor.

The photoconductor response is commonly measured by means of a voltage divider, which applies a constant DC bias voltage to the photoconductor. Any instability or deviation of the DC voltage directly affects the output signal and lead to measurement errors. Additionally, the 1/f noise depends on $I_{DC}$. Thus, a constant DC voltage as bias is also disadvantageous.

Additionally, in order to obtain the maximum output signal of the voltage divider, the resistor values should be the same or at least in the same order of magnitude. As soon resistance of the photoconductor changes, the system drifts from the optimal working point.

Also, as a response to DC bias voltages, resistance of the detectors may drift, probably due to electrochemical processes in the detector material. A modulated bias voltage with a higher frequency than the reaction time of the electrochemical processes, such as ion drifts, may reduce the resistance drift of the photoconductor.

In addition to that, the photoconductors may feature a resistance asymmetry, which means depending on the polarity of the bias voltage, the resistance may be difference.

Problem Addressed by the Invention

Therefore, a problem addressed by the present invention is that of specifying a photoconductor readout circuit and a detector which at least substantially avoid the disadvantages of known circuits of this type. In particular, an improved, in particular more reliable, and cost-effective readout of a photoconductor would be desirable.

SUMMARY OF THE INVENTION

This problem is solved by the invention with the features of the independent patent claims. Advantageous developments of the invention, which can be realized individually or in combination, are presented in the dependent claims and/or in the following specification and detailed embodiments.

In a first aspect of the present invention, a device is disclosed. The device comprises at least one photoconductor configured for exhibiting an electrical resistance $R_{photo}$ dependent on an illumination of a light-sensitive region of the photoconductor; at least one photoconductor readout circuit, wherein the photoconductor readout circuit is configured for determining a differential voltage related to changes of the electrical resistance $R_{photo}$ of the photoconductor, wherein the photoconductor readout circuit comprises at least one bias voltage source configured for applying at least one periodically modulated bias voltage to the photoconductor such that the electric output changes its polarity at least once; and at least one electrical circuit configured to balance the differential voltage at a given illumination level.

The term "photoconductor", also denoted as photoresistor, as used herein is a broad term and is to be given its ordinary and customary meaning to a person of ordinary skill in the art and is not to be limited to a special or customized meaning. The term specifically may refer, without limitation, to a light sensitive element capable of exhibiting a specific electrical resistance $R_{photo}$ dependent on an illumination of the light-sensitive region the photoconductor. Specifically, the electrical resistance is dependent on the illumination of a material of the photoconductor. As will be outlined in detail below, the photoconductor may comprise a light-sensitive region comprising a "photoconductive material". A photoconductor can, for example, be applied in light-sensitive detector circuits.

The term "illumination" as used herein is a broad term and is to be given its ordinary and customary meaning to a person of ordinary skill in the art and is not to be limited to a special or customized meaning. The term specifically may refer, without limitation, to electromagnetic radiation in one or more of the visible spectral range, the ultraviolet spectral range and the infrared spectral range. Therein, in partial accordance with standard ISO-21348, the term visible spectral range generally refers to a spectral range of 380 nm to 760 nm. The term infrared (IR) spectral range generally refers to electromagnetic radiation in the range of 760 nm to 1000 μm, wherein the range of 760 nm to 1.4 μm is usually denominated as the near infrared (NIR) spectral range, and the range from 15 μm to 1000 μm as the far infrared (FIR) spectral range. The term "ultraviolet spectral range" generally refers to electromagnetic radiation in the range of 1 nm to 380 nm, preferably in the range of 100 nm to 380 nm. In the following, the term "illumination" is also denoted as "light". Preferably, illumination as used within the present invention is visible light, i.e. light in the visible spectral range, and/or infrared light, i.e. light in the infrared spectral range.

As used herein, the term "light-sensitive region of the photoconductor" generally refers to an area of the photoconductor being sensitive to an illumination, e.g. by an incident light beam. For example, the light-sensitive region may be a two-dimensional or three-dimensional region which preferably, but not necessarily, is continuous and can form a continuous region. The photoconductor can have one or else a plurality of such light-sensitive regions. As used herein, the term "to exhibit an electrical resistance $R_{photo}$ dependent on an illumination" generally refers to that the electrical resistance of the photoconductor is adjusted and/or changed and/or varied dependent, on the illumination, in particular an intensity of the illumination, of the light-sensitive region. In particular, in response to the illumination, the electrical resistance is adjusted and/or changed and/or varied. When the photoconductor is illuminated the photoconductor may exhibit a decrease in electrical resistance. The photoconductor may lower its resistivity when illuminated. Specifically, the electrical resistance of the photoconductor may decrease with increasing incident light intensity. The change between dark resistance and bright resistance is the quantity to be measured or to be read out. As used herein, the term "dark resistance" generally refers to an electrical resistance of the photoconductor in unlit state, i.e. without illumination. As further used herein, the term "bright resistance" refers to an electrical resistance of the photoconductor under illumination. For measuring and/or read out generally voltage divider circuits are known which have a non-linear behavior. A linear change in the resistance of the photoconductor leads to a non-linear change in the voltage output. The present invention, as will be outlined in more detail below, proposes circuit features having a linear behavior.

The photoconductor may comprise at least one photoconductive material. Since an electrical resistance is defined as the reciprocal value of the electrical conductivity, alternatively, the term "photoresistive material" may also be used to denominate the same kind of material. The light-sensitive region may comprise at least one photoconductive material selected from the group consisting of lead sulfide (PbS); lead selenide (PbSe); mercury cadmium telluride (HgCdTe); cadmium sulfide (CdS); cadmium selenide (CdSe); indium antimonide (InSb); indium arsenide (InAs); indium gallium arsenide (InGaAs); extrinsic semiconductors, e.g. doped Ge, Si, GaAs, organic semiconductors. However, other materials may be feasible. Further possible photoconductive materials are described in WO 2016/120392 A1, for example. For example, the photoconductor may be a photoconductor commercially available under the brand name Hertzstueck™ from trinamiX GmbH, D-67056 Ludwigshafen am Rhein, Germany.

For example, the light-sensitive region may be illuminated by at least one illumination source. The illumination source can for example be or comprise an ambient light source and/or may be or may comprise an artificial illumination source. By way of example, the illumination source may comprise at least one infrared emitter and/or at least one emitter for visible light and/or at least one emitter for ultraviolet light. By way of example, the illumination source may comprise at least one light emitting diode and/or at least one laser diode. The illumination source can comprise in particular one or a plurality of the following illumination sources: a laser, in particular a laser diode, although in principle, alternatively or additionally, other types of lasers can also be used; a light emitting diode; an incandescent lamp; a neon light; a flame source; an organic light source, in particular an organic light emitting diode; a structured light source. Alternatively or additionally, other illumination sources can also be used. The illumination source generally may be adapted to emit light in at least one of: the ultraviolet spectral range, the infrared spectral range. Most preferably, at least one illumination source is adapted to emit light in the NIR and IR range, preferably in the range of 800 nm and 5000 nm, most preferably in the range of 1000 nm and 4000 nm.

The illumination source may comprise at least one non-continuous light source. Alternatively, the illumination source may comprise at least one continuous light source. The light source may be an arbitrary light source having at least one radiating wavelength having an overlap to the sensitive wavelength of the photosensitive detector. For example, the light source may be configured for generating a Planckian radiation. For example, the light source may comprise at least one light emitting diode (LED) and/or at least one Laser source. For example, the light source may be configured for generating illumination by an exotherm reaction, like an oxidation of liquid or solid-material or Gas. For example, the light source may be configured for generating illumination out of fluorescent effects. The illumination source may be configured for generating at least one modulated light beam. Alternatively, the light beam generated by the illumination source may be non-modulated and/or may be modulated by further optical means. The illumination source may comprise at least one optical chopper device configured for modulating a light beam from the continuous light source. The optical chopper device may be configured for periodically interrupting the light beam from the continuous light source. For example, the optical chopper device may be or may comprise at least one variable frequency rotating disc chopper and/or at least one fixed frequency tuning fork chopper and/or at least one optical shutter. The proposed device may measure and/or determine the resistance of the photoconductor independent of light modulation frequency. Thus, the proposed device allows the measurement of the photoconductor resistance for illumination sources without modulated light intensities.

The term "photoconductor readout circuit" as used herein is a broad term and is to be given its ordinary and customary meaning to a person of ordinary skill in the art and is not to be limited to a special or customized meaning. The term specifically may refer, without limitation, to an electronic circuit configured for readout of at least one photoconductor and/or a plurality of photoconductors.

The photoconductor readout circuit is configured for determining a differential voltage related to changes of the electrical resistance $R_{photo}$ of the photoconductor. The term "determining a differential voltage" as used herein is a broad term and is to be given its ordinary and customary meaning to a person of ordinary skill in the art and is not to be limited to a special or customized meaning. The term specifically may refer, without limitation, to measuring differences, in particular changes, between voltages, in particular across the photoconductor such as at different time points and/or illumination states.

The photoconductor readout circuit comprises at least one bias voltage source configured for applying at least one periodically modulated bias voltage to the photoconductor such that the electric output changes its polarity at least once. The modulation can be uni- or bipolar. The frequency of the modulation can be chosen freely, but higher frequencies are recommended for low 1/f noise, preferably 20 to 1000 Hz, in particular 50 to 200 Hz. For example, the bias voltage modulation has a frequency of the power line frequency especially 50 Hz or 60 HZ.

The term "bias voltage source" as used herein is a broad term and is to be given its ordinary and customary meaning to a person of ordinary skill in the art and is not to be limited to a special or customized meaning. The term specifically may refer, without limitation, to at last one voltage source configured for generating the bias voltage. The bias voltage may be the voltage applied across the photoconductor material. The term "modulated bias voltage" as used herein is a broad term and is to be given its ordinary and customary meaning to a person of ordinary skill in the art and is not to be limited to a special or customized meaning. The term specifically may refer, without limitation, to a change of polarization of the bias voltage on the photoconductor. The term "periodically" modulated bias voltage as used herein is a broad term and is to be given its ordinary and customary meaning to a person of ordinary skill in the art and is not to be limited to a special or customized meaning. The term specifically may refer, without limitation, to change of the polarization of the bias voltage appearing and/or occurring at time intervals.

The bias voltage source may be configured for generating a permanent supply voltage, such as of 2 to 20V, in particular of around 8V. The photoconductor readout circuit may comprise at least one switching element for generating the periodically modulated bias voltage, such as of ±4V. For example, the switching element may comprise triggered switches. The term "triggered switch" as used herein is a broad term and is to be given its ordinary and customary meaning to a person of ordinary skill in the art and is not to be limited to a special or customized meaning. The term specifically may refer, without limitation, to a switch acting depending and/or in response to an arbitrary trigger, in particular a trigger signal. The trigger signal may be an external signal and/or may be generated by at least one element of the photoconductor readout circuit. For example, the photoconductor readout circuit may comprise at least one logic gate such as a not gate. The trigger signal may switch on the switch in case the trigger signal is 1. If the trigger signal is 0 the switch is switched off.

The resistance of the photoconductor $R_{photo}$ may change its value as a function of the incident illumination with a given modulation frequency, while the bias voltage $V_{Bias}$ changes its polarity multiple times. A frequency of the trigger may be much higher than the frequency of a modulation frequency of the illumination.

The photoconductor readout circuit comprises at least one electrical element configured to balance the differential voltage at a given illumination level. This allows only the measurement of the electrical output based on the change of $R_{photo}$ rather than its absolute value. Multiple ways of balancing the differential voltage are available, preferably a Wheatstone bridge or a sample-and-hold circuit are used. If a Wheatstone bridge cannot fully balance the differential voltage, a Wheatstone bridge can be combined with an offset digital-to-analog converter (DAC). When using sample-and-hold circuit, which measures the direct current (DC) part while the modulated light is off, this DC part can be used as the reference potential of the differential voltage measurement while the modulated light is on, or vice versa.

The term "electrical element" as used herein is a broad term and is to be given its ordinary and customary meaning to a person of ordinary skill in the art and is not to be limited to a special or customized meaning. The term specifically may refer, without limitation, to an arbitrary electrical component of the photoconductor readout circuit configured for performing the named functions. The electrical element may comprise, in particular contain, one or more of at least one Wheatstone bridge and a sample-and-hold circuit.

The term "Wheatstone bridge" as used herein is a broad term and is to be given its ordinary and customary meaning to a person of ordinary skill in the art and is not to be limited to a special or customized meaning. The term specifically may refer, without limitation, to an electrical circuit configured for determining an unknown electrical resistance by balancing two legs of a bridge circuit, wherein one of the legs comprises the unknown electrical resistance. For example, the Wheatstone bridge may comprise four resistances, e.g. R1, R2, R3 and $R_{photo}$. R1, R2 and R3 may have known resistances, wherein at least one of said resistances, e.g. R2, may be adjustable. $R_{photo}$ may be the resistance of the photoconductor. The resistances may be arranged in two legs, a known leg comprising known resistances, e.g. R1 and R2, and an unknown leg comprising the unknown resistance $R_{photo}$ and e.g. R3. The resistance R2 may be adjustable until the Wheatstone bridge is balanced such that the voltage between two midpoints between the legs are zero. In this balanced status, a ratio of the two resistances in the known leg (R2/R1) may be equal to a ratio of the two resistances in the unknown leg ($R_{photo}$/R3). Thus, in the balanced status the differential voltage may be balanced to 0V by adjustment of at least one of the resistances. When illuminated the resistance of the photoconductor is changing its properties, and so the Wheatstone Bridge results in a differential voltage different from 0V. The device may comprise a voltage source Vs configured for applying a direct current (DC) voltage or an alternating current (AC) voltage to the Wheatstone Bridge. Therefore, the Wheatstone Bridge may be connected to the voltage source Vs. The photoconductor may be connected to the bias voltage source such that the bias voltage source can apply the bias voltage to the photoconductor.

The term "sample-and-hold circuit" as used herein is a broad term and is to be given its ordinary and customary meaning to a person of ordinary skill in the art and is not to be limited to a special or customized meaning. The term specifically may refer, without limitation, to an electric circuit configured for sampling voltage of a continuously varying analog signal and holding its value at a constant level for a specified minimum period of time. The sample-and-hold-circuit may comprise at least one analog input, at least one analog output, and at least one control signal. The sample-and-hold circuit may comprise at least one capacitor configured for storing electric charge. The sample-and-hold circuit may comprise the at least one switching element, such as a field effect transistor (FET) switch, and at least one operational amplifier. The capacitor may be configured for sampling an input voltage in case the switching element connects the capacitor to an output of the amplifier. The amplifier may be configured for charging or discharging the capacitor such that voltage across the capacitor is equal and/or proportional to the input voltage. The switching element may be configured for disconnecting the capacitor from the amplifier for holding. The resistance $R_{photo}$ may change its value as a function of the incident illumination with a given modulation frequency, while the bias voltage $V_{Bias}$ may change its polarity multiple times during one period of illumination modulation. The sample-and-hold circuit may be configured for sampling a reference voltage $V_{Ref}$ while the illumination is off. The sample-and-hold circuit may be configured for holding the reference voltage for the measurement of the differential voltage $V_{Diff}$ while the illumination is on. The reference voltage measurement may be performed while the illumination is on. The difference voltage measurement may be performed while the illumination is off.

The term "balance the differential voltage" as used herein is a broad term and is to be given its ordinary and customary meaning to a person of ordinary skill in the art and is not to be limited to a special or customized meaning. The term specifically may refer, without limitation, to a process or status in which the differential voltage between at least two points of the photoconductor readout circuit is zero at a given illumination level.

Any change of the illumination of the photoconductor will lead to a change in electrical output. The differential voltage can be amplified to utilize the whole dynamic range of an analog-to-digital converter (ADC). Thus, the change of the electrical output can be resolved with relatively high resolution with low-cost read-out electronics. Both the light and excitation signal can be modulated at different frequencies. The light signal may also be denoted herein as the modulated light beam. The excitation signal may also denoted herein as bias voltage. A higher excitation frequency is recommended to reduce the 1/f noise further. A modulated light is recommended to reduce the generation-recombination noise, yet compared to flicker noise, it is small, and the measurement can also be performed without any light modulation.

The photoconductor readout circuit may comprise at least one amplifier, in particular at least one impedance converter, configured for amplifying the output signal.

The device, in particular the photoconductor readout circuit, may comprise at least one coupling to at least one evaluation device. The photoconductor readout circuit may comprise at least one rectifier and at least one further voltage divider for coupling to a low voltage evaluation system such as at least one microcontroller for the frequency measurement. The coupling may comprise at least one diode and at least one coupling voltage divider circuit. The coupling may be arranged at the output of the comparator circuit.

The photoconductor readout circuit may comprise a plurality of photoconductors. The photoconductors may be arranged in an array. The photoconductor readout circuit may be configured for determining electrical resistance of each photoconductor of the plurality of photoconductors. The photoconductor readout circuit for readout of the plurality of photoconductors may comprise at least one logic gate such as a programmable logic, e.g. at least one Field Programmable Gate Array (FPGA), integrated circuit with a single or multiple input channels, a microprocessor with single or multiple inputs. The FPGA may be configured as a free running ring oscillator. Due to this, it may be possible to generate a very high time resolution in the measurement of an output frequency of the comparator.

The photoconductors of the array each may respond to electromagnetic energy of a different wavelength. In particular, the photoconductors may detect electromagnetic absorption at different wavelengths in the electromagnetic spectrum. The array of photoconductors may be designed such that each pixel in the array responds to electromagnetic energy of a different wavelength. For example, at least one filter arrangement may be used. However, other arrangements are possible. This may allow using the array for spectrometer applications.

The photoconductor readout circuit may further comprise at least one analog-to-digital converter (ADC) configured for converting the output signal into a digital signal, specifically for further evaluation.

The photoconductor readout circuit may be embodied as integrated circuit. The term "integrated circuit" as used herein is a broad term and is to be given its ordinary and customary meaning to a person of ordinary skill in the art and is not to be limited to a special or customized meaning. The term specifically may refer, without limitation, to an electronic circuit on a substrate such as a semiconductor substrate. For example, the integrated circuit may be embodied as a microchip.

In a further aspect of the present invention, a detector comprising at least one photoconductor readout circuit according to the present invention is disclosed. The detector furthermore comprises the detector comprises at least one evaluation device configured for determining an output signal of at least one output of the photoconductor readout circuit of the device, wherein the evaluation device is configured for determining an illumination intensity by evaluating the output signal.

As used herein, the term "evaluation device" generally refers to an arbitrary device designed to determine and/or generating at least one voltage output signal at the voltage output. As an example, the evaluation device may be or may comprise one or more integrated circuits, such as one or more application-specific integrated circuits (ASICs), and/or one or more data processing devices, such as one or more computers, preferably one or more microcomputers and/or microcontrollers. Additional components may be comprised, such as one or more preprocessing devices and/or data acquisition devices, such as one or more devices for receiving and/or preprocessing of the voltage signal, such as one or more AD-converters and/or one or more filters. Further, the evaluation device may comprise one or more data storage devices. The evaluation device may comprise one or more interfaces, such as one or more wireless interfaces and/or one or more wire-bound interfaces. The evaluation device may particularly comprise at least one data processing device, in particular an electronic data processing device, which can be designed to determine at least one output voltage signal. The evaluation device can also be designed to completely or partly control the at least one illumination source and/or to control the at least one voltage source and/or to adjust the at least one load resistor. The evaluation device may further comprise one or more additional components, such as one or more electronic hardware components and/or one or more software components, such as one or more measurement units and/or one or more evaluation units and/or one or more controlling units. For example, the evaluation device may comprise at least one measurement device adapted to measure the at least one output voltage signal, e.g. at least one voltmeter. The evaluation device may be configured for performing one or more operations of the group consisting of: at least one Fourier transformation; a counting of frequency, an edge detection, a measurement of the period length and the like.

The detector may comprise at least one illumination source.

For further details concerning this aspect of the present invention, in particular further details of the photoconductor readout circuit, the evaluation device and the optional illumination source, reference may be made to the description of the photoconductor readout circuit as provided above and in more detail below.

In a further aspect of the present invention, a use of a device according to the present invention is disclosed for a purpose of readout of one or more of at least one PbS sensor, at least one PbSe sensor, or at least one pixelated sensor array comprising a plurality of pixels, wherein each of the pixels comprises at least one PbS or PbSe sensor. In particular, the device according to the present invention may be used in modest or low bias voltage applications, for example in applications where devices are battery operated or need to run on low power e.g. sensor nodes, portable measurement devices, devices in explosive atmospheres, allowing an improved signal-to-noise ratio and thus high signal quality. For example, the voltage divider circuit may be used in spectrometers, moisture measurement instruments, thickness measurement instruments, gas analysis instruments or any other type of equipment using photoresistors as sensor element. The device may be used in optical sensors. For example, the voltage divider circuit may be used in optical sensors which employ the so-called FiP effect, for example WO 2012/110924 A1, WO 2014/097181 A1 and WO 2016/120392 A1. Known voltage divider circuits cannot measure the change of the resistance with high resolution without any light modulation, such that the spectrometers with photoconductive detectors can only be realized with dispersive elements and multiple pixels. Single pixel spectrometers use photodiodes and other current generating detectors, like InGaS, Si-Photodiodes etc., due to their stability which allows the measurement without light modulation. Since the device according to the present invention can measure the resistance change of the photoconductor without any light modulation with high precision, single pixel spectrometers based on Michelson Interferometers, or Fabry Perot Interferometer etc. can be realized also with photoconductive detectors. The proposed device with all the mentioned advantages may be used to build single pixel spectrometers.

Summarizing, in the context of the present invention, the following embodiments are regarded as particularly preferred:

Embodiment 1. A device comprising
at least one photoconductor configured for exhibiting an electrical resistance $R_{photo}$ dependent on an illumination of a light-sensitive region of the photoconductor; at least one photoconductor readout circuit, wherein the photoconductor readout circuit is configured for determining a differential voltage related to changes of the electrical resistance $R_{photo}$ of the photoconductor, wherein the photoconductor readout circuit comprises at least one bias voltage source configured for applying at least one periodically modulated bias voltage to the photoconductor such that the electric output changes its polarity at least once; and at least one electrical element configured to balance the differential voltage at a given illumination level.

Embodiment 2. The device according to the preceding embodiment, wherein the photoconductor readout circuit contains a Wheatstone bridge or a sample-and-hold circuit.

Embodiment 3. The device according to any one of the preceding embodiments, wherein the bias voltage modulation is unipolar or bipolar.

Embodiment 4. The device according to any one of the preceding embodiments, wherein the bias voltage modulation has a frequency of at least 50 Hz.

Embodiment 5. The device according to any one of the preceding embodiments, wherein the device comprises at least one coupling to at least one evaluation device.

Embodiment 6. The device according to any one of the preceding embodiments, wherein the illumination is modulated.

Embodiment 7. The device according to any one of the preceding embodiments, wherein the light-sensitive region comprises at least one photoconductive material selected from the group consisting of lead sulfide (PbS); lead selenide (PbSe); mercury cadmium telluride (HgCdTe); cadmium sulfide (CdS); cadmium selenide (CdSe); indium antimonide (InSb); indium arsenide (InAs); indium gallium arsenide (InGaAs); extrinsic semiconductors, organic semiconductors.

Embodiment 8. A detector comprising at least one device according to any one of the preceding embodiments, wherein the detector comprises at least one evaluation device configured for determining an output signal of at least one output of the photoconductor readout circuit of the device, wherein the evaluation device is configured for determining an illumination intensity by evaluating the output signal.

Embodiment 9. The detector according to the preceding embodiment, wherein the evaluation device is configured for performing one or more operations of the group consisting of: at least one Fourier transformation; a counting of frequency, an edge detection, a measurement of the period length.

Embodiment 10. Use of a device according to any one of the preceding embodiments referring to device, for a purpose of readout of one or more of at least one PbS sensor, at least one PbSe sensor, or at least one pixelated sensor array comprising a plurality of pixels, wherein each of the pixels comprises at least one PbS or PbSe sensor.

BRIEF DESCRIPTION OF THE FIGURES

Further optional details and features of the invention are evident from the description of preferred exemplary embodiments which follows in conjunction with the dependent claims. In this context, the particular features may be implemented alone or with features in combination. The invention is not restricted to the exemplary embodiments. The exemplary embodiments are shown schematically in the figures. Identical reference numerals in the individual figures refer to identical elements or elements with identical function, or elements which correspond to one another with regard to their functions.

Specifically, in the figures:

FIGS. 2a to 2d illustrates an electrical circuit to measure the differential voltage VDiff with AC and modulated light intensity, FIGS. 2a-d show time dependent source voltage (2a), biased voltage (2b), measured voltage (2c), and light modulation (2d)

EXEMPLARY EMBODIMENTS

Figure 1A:
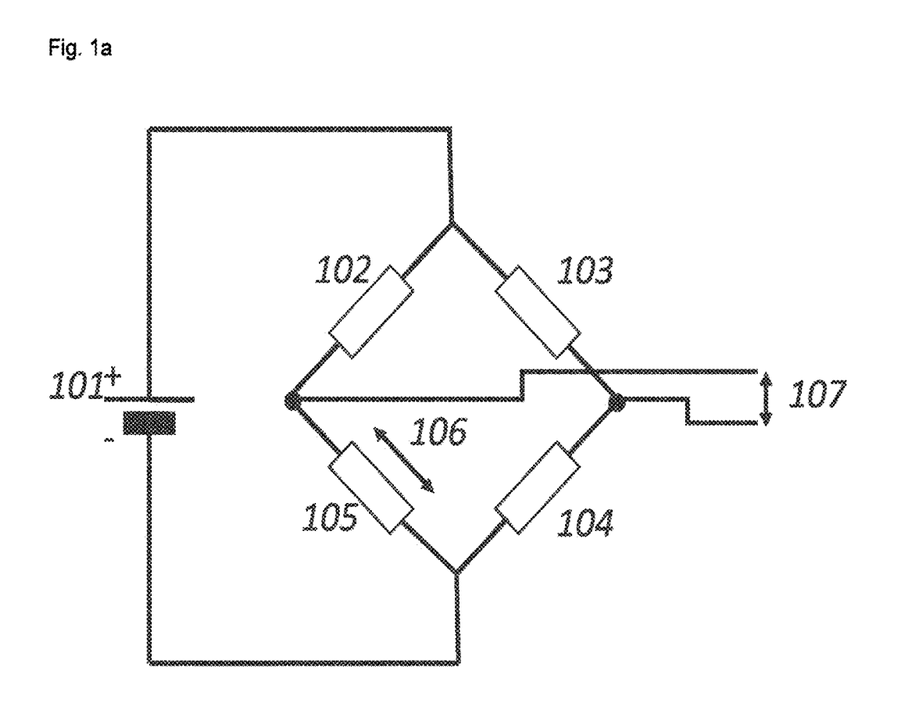
FIG. 1a illustrates an electrical circuit to measure the differential voltage VDiff with DC.

FIG. 1 shows the most commonly used way measure to the differential voltage 107 in dependence of the resistor 105 by a Wheatstone Bridge in DC 101 operation. A Wheatstone bridge is a standard for a circuit, where differential voltage could be balanced to 0V by adjustment of the resistors 102, 103 and 104.

One of the resistors of the Wheatstone Bridge can be replaced by a photoconductor 105 with a suitable resistance but darkened. Photoconductors are sensors, which require an external excitation signal to generate an electrical output depending on the measured physical quantity. In the case of photoconductors is this physical quantity the illumination. Most commonly, a voltage $V_{Bias}$ 106 is applied to the photoconductor 105 as excitation signal.

The photoconductor 105 change their resistance depending on the illumination. The change itself is relatively small compared to the total resistance value of the photoconductor. As an example, a PbS-detector with dimension of 2 mm×2 mm featuring a resistance of about 1 MΩ changes its resistance due to infrared radiation at 1550 nm with an irradiance of 16 μW/cm2 about 10 kΩ, which corresponds 1% change. Thus, the excitation signal will be orders of magnitude greater than the electrical output change due to the illumination. Without any filtering, the read-out electronics should be able to measure the whole signal but still solve the change of 1% with a relatively good resolution. Such read-out electronics are commercially available, yet very expensive.

Photoconductors, PbS, PbSe etc., as other types of resistors like carbon composite, thick film resistors etc., exhibit a strong 1/f noise, also known as flicker noise, which is dominant at smaller frequencies. 1/f noise depends strongly on the DC part of the current IDC, flowing through the photoconductor.

The 1/f noise dominates at lower frequencies. The change of $R_{photo}$ should be measured at higher frequencies to eliminate the 1/f-noise. The measurement noise can be reduced by modulating the current flowing through the photoconductor, by modulating the resistance of the conductor $R_{Photo}$ or modulating the excitation signal.

Most commonly, either the light source is modulated or the light path from the light source to the detector is chopped, for example with a mechanical setup, such as a chopper or shutter etc. The modulated signal is then demodulated in analog or digital domain but keeps the 1/f noise at the modulation frequency, thus reducing the 1/f noise.

When illuminated the resistor $R_{photo}$ is changing its properties, and so the Wheatstone Bridge results in a differential voltage different from 0V. Any drift of the bias voltage 106 due to a temperature instability of the system can be balanced with the darkened photoconductor 105 and the differential voltage 107 will remain 0V during the on-phase or the off-phase of the light modulation.

Figure 1B:
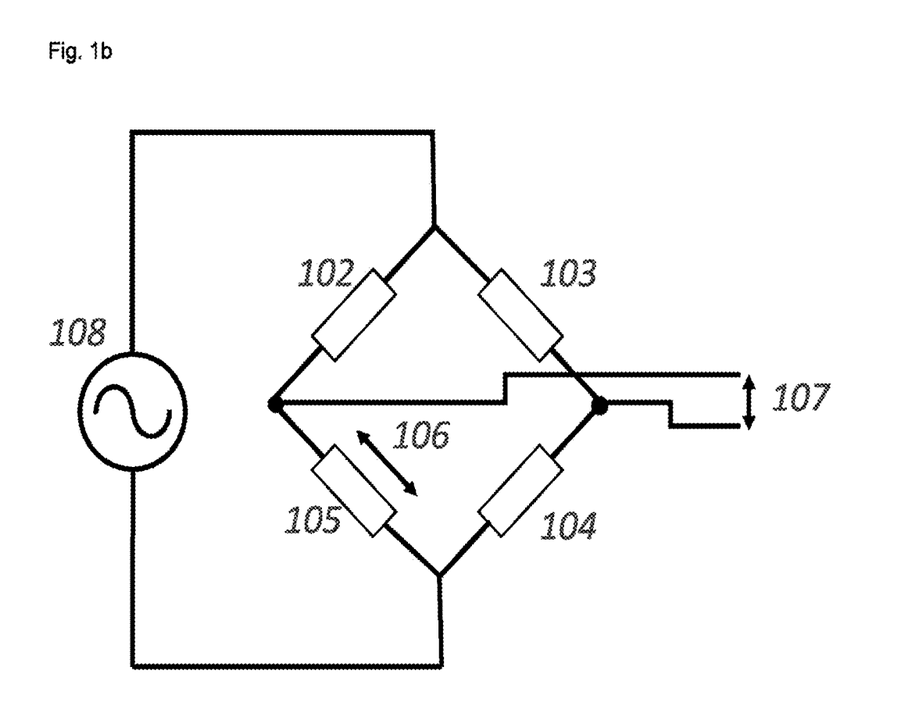
FIG. 1b illustrates an electrical circuit to measure the differential voltage VDiff with AC.

Changing the polarity of the source voltage 108 changes polarity of the bias voltage 106. This setup is shown in FIG. 1b. Since the change of the electrical output due to the illumination is measured by changing the polarity of the bias voltage more than once, the asymmetry of resistance of the photoconductor which was mentioned above may not affect further measurement. Measurement is done between two changes of polarity of voltage.

Figure 2:
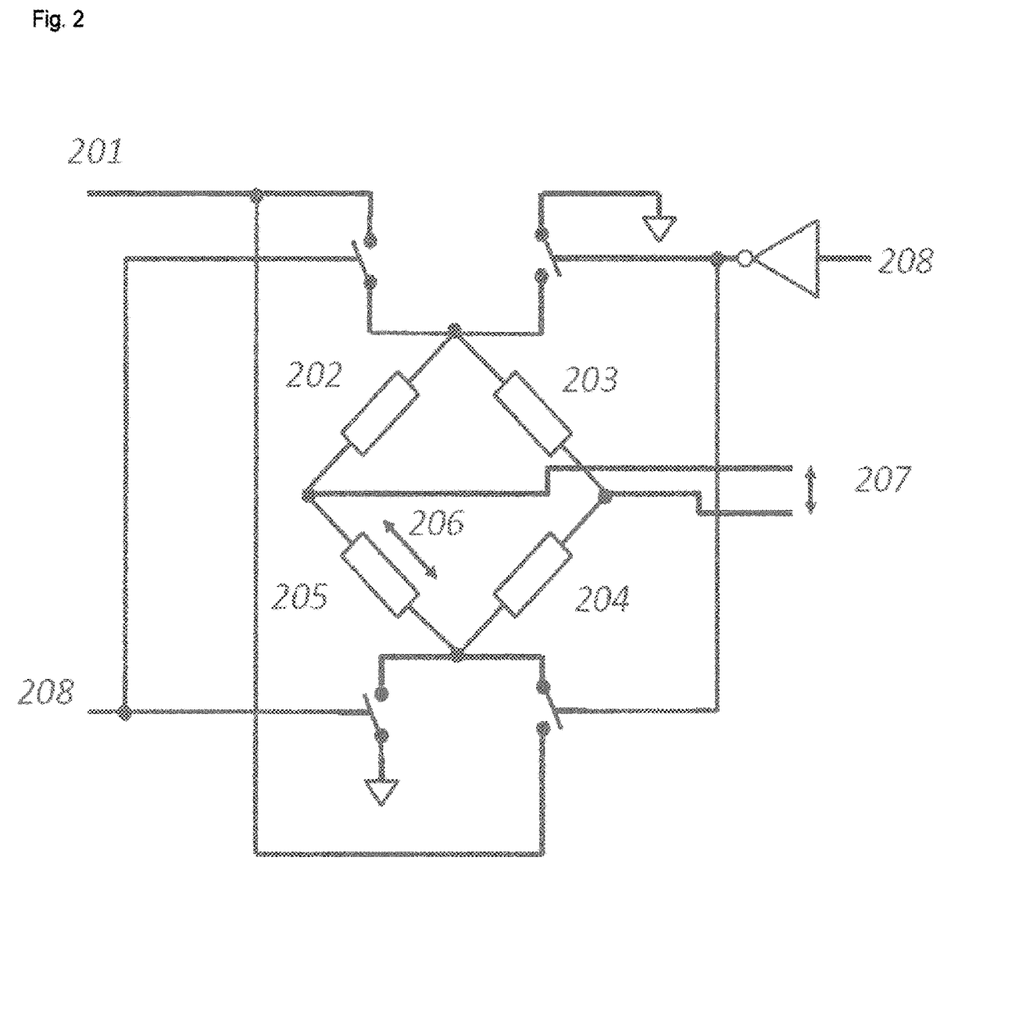
Figure 3:
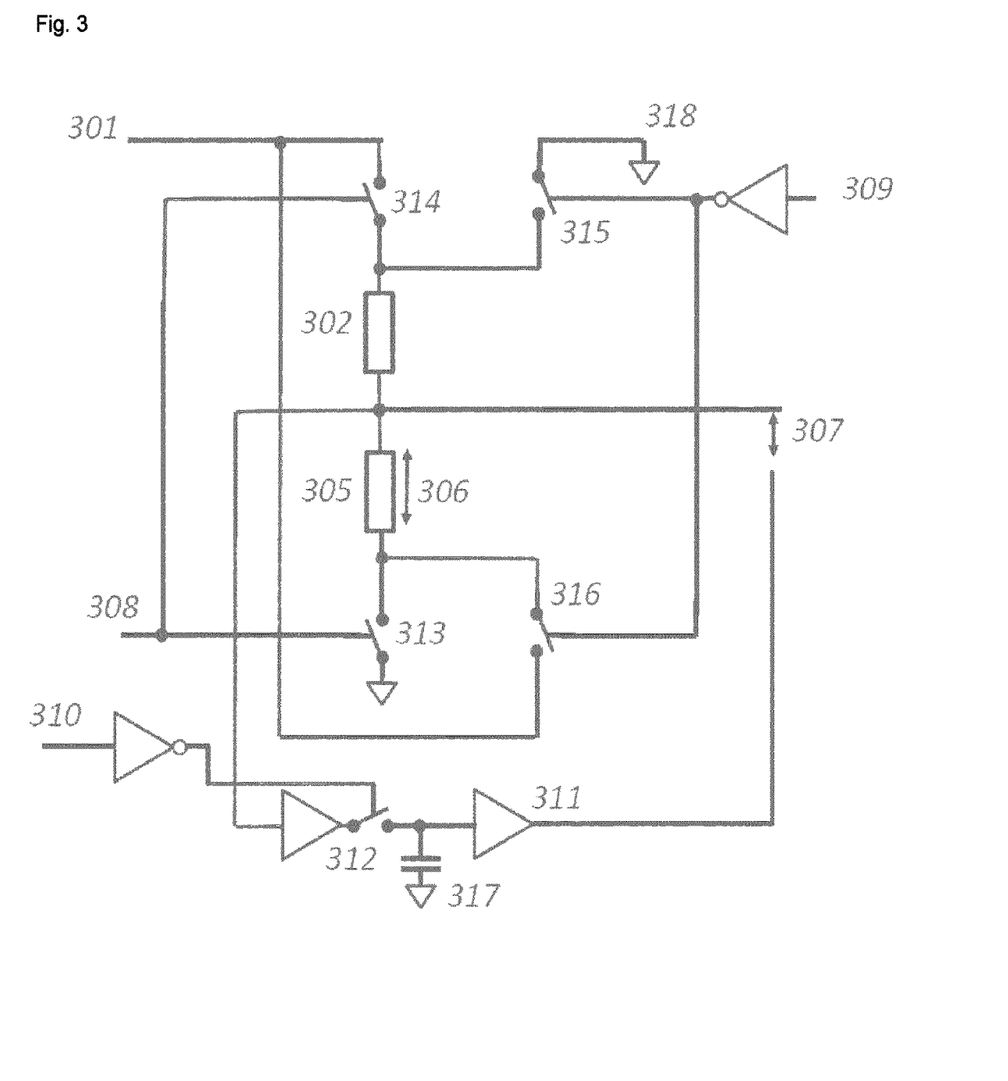
FIG. 3 illustrates the new electrical circuit to measure the differential voltage VDiff in dependence of the photo resistance $R_{photo}$ by a sample and hold circuit.

FIGS. 2 and 3 show embodiments of a device according to the present invention.

Figure 2A:
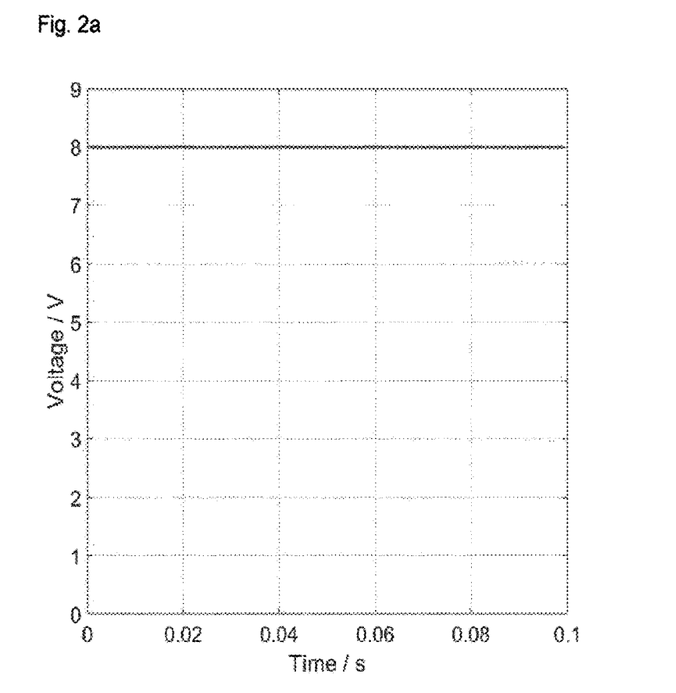
Figure 2B:
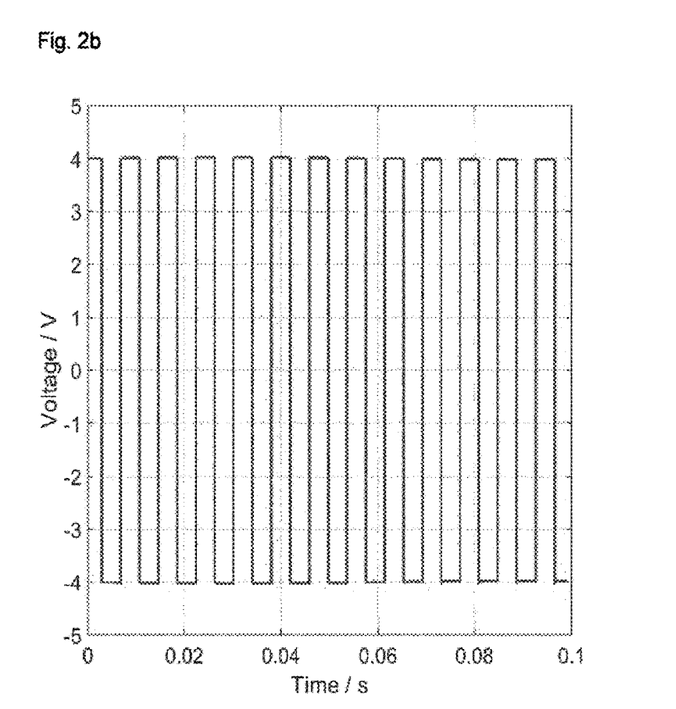
Figure 2C:
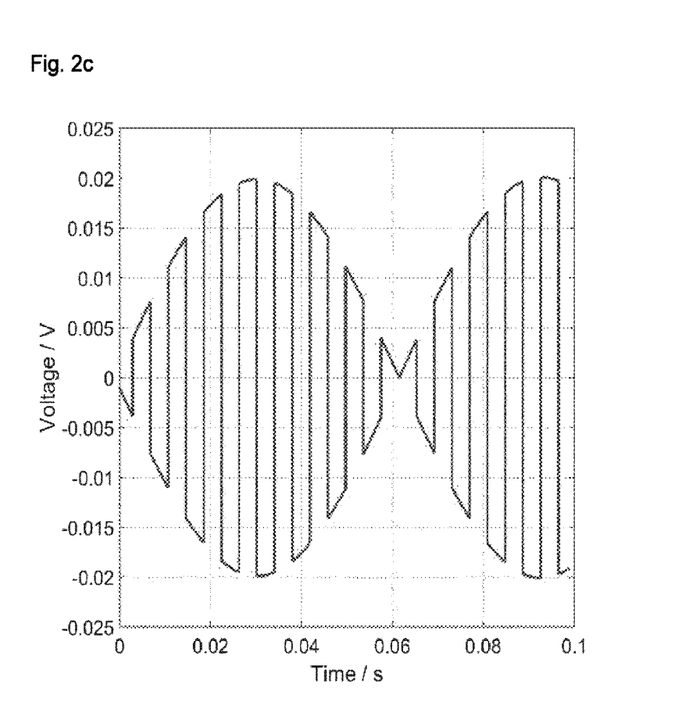

FIG. 2 shows the photoconductor readout circuit to measure the differential voltage 207 in dependence of the resistance $R_{photo}$ 205 by a Wheatstone Bridge. The resistance $R_{photo}$ 205 changes its value $\Delta R_{photo}$ as a function of the incident illumination with a given modulation frequency, while the bias voltage $V_{Bias}$ changes its polarity multiple times. Therefore a photoconductor readout circuit as described before is used with time dependent outer parameters as shown in FIGS. 2a-d. A permanent supply voltage 201 of 8V is applied to the circuit. FIG. 2a shows the supply voltage as a function of time. The supply voltage is switched via triggered switches to get a biased voltage 206 of +/−4V in the Wheatstone Bridge. This biased voltage is shown in FIG. 2b. The measured differential voltage as a function of time is shown in FIG. 2c. The illumination of the photo resistor is modified by modulation of the illumination source, such as a lamp, with a period shown I FIG. 2d. The frequency of the trigger 208 is much higher than the frequency of the lamp modulation.

Figure 2D:
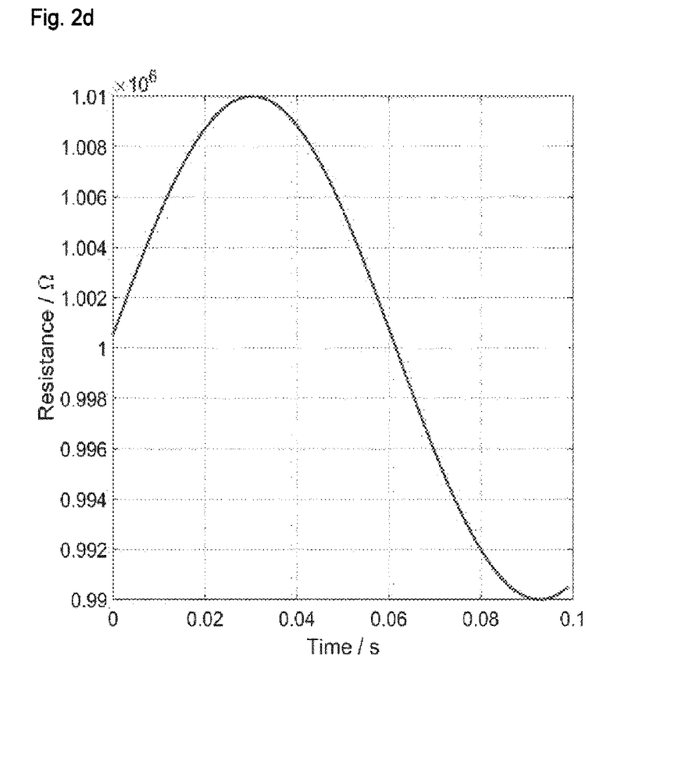

The resulting output voltage 207 is shown in FIG. 2d. It is an overlay of both modulated inputs whereas the high trigger frequency 208 reduces the 1/f noise as proposed.

In FIG. 2, the photoconductor readout circuit comprise the Wheatstone Bridge as described with respect to FIG. 1. The Wheatstone Bridge may comprise four resistors $R_1$ 202, $R_2$ 203, $R_3$ 204 and 205, wherein the resistance 205 is the resistance of the photoconduction $R_{Photo}$. The Wheatstone Bridge may be connected to the voltage source Vs, denoted with reference number 201. The photoconductor may be connected to the bias voltage source configured for applying the bias voltage $V_{Bias}$ 206 across the photoconductor. The bias voltage 206 is a periodically modulated bias voltage. The bias voltage source may be configured for generating a permanent supply voltage. The photoconductor readout circuit may comprise at least one switching element for generating the periodically modulated bias voltage. For example, the switching element may comprise triggered switches. The triggered switches may act depending and/or in response to the trigger 208, in particular a trigger signal. The trigger signal may be an external signal and/or may be generated by at least one element of the photoconductor readout circuit. For example, in the embodiment of FIG. 2, the photoconductor readout circuit may comprise two sub-circuits for applying the bias signal to the Wheatstone Bridge between resistors 202 and 203 and on the right side between resistors 204 and 205. Each sub-circuit may comprise a triggered switch comprising a connection to the trigger 208 and at least one logic gate such as a not gate. For example, the trigger signal may switch on the triggered switch one of the sub-circuits, e.g. the sub-circuit on the left side of FIG. 2, in case the trigger signal is 1. At the same the triggered switch of the other sub-circuit is switched off. If the trigger signal is 0, the switches may be switched off and on the other way round.

Even if the differential voltage cannot be balanced by means of a Wheatstone Bridge, the resulting offset can be compensated with the help of further electronic components such as "Offset DAC". Another possible implementation is a sample and hold circuit, which measures (samples) the DC part while the modulated light is off and use it as the reference potential of the differential voltage measurement while the modulated light is switched on, or vice versa. Independent of any temperature or electrochemical drift of $R_{Photo}$, the reference voltage $V_{Ref}$ will always be recalibrated when a sample and hold circuit is used.

An example for the inventive photoconductor readout circuit is shown in FIG. 3. A supply voltage 301 is applied via switches 312-316 to the resistors 302 and the photoresistor 305. The applied voltage is triggered by outer signal 308 and the negated signal 309, whereas the lamp is modulated by the trigger signal 310. The resistance 305 $R_{photo}$ changes its value $\Delta R_{Photo}$ as a function of the incident illumination with a given modulation frequency 301, while the bias voltage $V_{Bias}$ 306 changes its polarity multiple times during one period of lamp modulation, whereas the sample and hold circuit samples a reference voltage $V_{Ref}$ 311 while the lamp is off 312 and holds it for the measurement of $V_{Diff}$ 307 while the lamp is on. The reference voltage measurement can be performed while the lamp is on, and the difference voltage measurement can be performed while the lamp is off. The lamp modulation can be sinusoidal, square, triangular or in any other waveforms. The lamp can be turned off for the reference measurement in the beginning of a measurement set, while multiple measurements of $V_{Diff}$ may be performed at different illumination intensities and/or at different wavelengths, as long as the change in the intensity or wavelength of the illumination is slower than the modulation frequency of the bias voltage.

LIST OF REFERENCE NUMBERS 101 source voltage $V_S$
102 resistor $R_1$
103 resistor $R_2$
104 resistor $R_3$
105 photoresistor $R_{Photo}$
106 bias voltage $V_{Bias}$
107 output voltage $V_{Diff}$
108 source AC
201 source $V_S$
202 resistor $R_1$
203 resistor $R_2$
204 resistor $R_3$
205 photoresistor $R_{Photo}$
206 bias voltage $V_{Bias}$
207 output voltage $V_{out}$
208 trigger
301 source $V_S$
302 resistor $R_1$
305 photoresistor $R_{Photo}$
306 bias voltage $V_{Bias}$
307 output voltage $V_{out}$
308 trigger AC
309 trigger AC
310 lamp trigger
311 component
312 switch
313 switch
314 switch
315 switch
316 switch
317 ground
318 ground

The invention claimed is:

1. A device comprising:
    at least one photoconductor configured for exhibiting an electrical resistance $R_{photo}$ dependent on an illumination of a light-sensitive region of the photoconductor;
    at least one photoconductor readout circuit, wherein the photoconductor readout circuit is configured for determining a differential voltage related to changes of the electrical resistance $R_{photo}$ of the photoconductor, wherein the photoconductor readout circuit comprises at least one bias voltage source configured for applying at least one periodically modulated bias voltage to the photoconductor such that an electric output changes its polarity at least once; and
    at least one electrical element configured to balance the differential voltage at a given illumination level.

2. The device according to claim 1, wherein the photoconductor readout circuit comprises a Wheatstone bridge or a sample-and-hold circuit.

3. The device according to claim 1, wherein the at least one periodically modulated bias voltage modulation is unipolar or bipolar.

4. The device according to claim 1, wherein the at least one periodically modulated bias voltage modulation has a frequency of a power line frequency.

5. The device according to claim 1, wherein the device comprises at least one coupling to at least one evaluation device.

6. The device according to claim 1, wherein the illumination is modulated.

7. The device according to claim 1, wherein the light-sensitive region comprises at least one photoconductive material selected from a group consisting of lead sulfide (PbS); lead selenide (PbSe); mercury cadmium telluride (HgCdTe); cadmium sulfide (CdS); cadmium selenide (CdSe); indium antimonide (InSb); indium arsenide (InAs); indium gallium arsenide (InGaAs); extrinsic semiconductors; and organic semiconductors.

8. A detector comprising at least one device according to claim 1, wherein the detector comprises at least one evaluation device configured for determining an output signal of at least one output of the photoconductor readout circuit of the device, wherein the at least one evaluation device is configured for determining an illumination intensity by evaluating the output signal.

9. The detector according to claim 8, wherein the at least one evaluation device is configured for performing one or more operations selected from a group consisting of: at least one Fourier transformation; a counting of frequency; an edge detection; and a measurement of the period length.

10. A method of using a device according to claim 1, the method comprising determining readout of one or more of at least one PbS sensor, at least one PbSe sensor, or at least one pixelated sensor array comprising a plurality of pixels, wherein each of the pixels comprises at least one PbS or PbSe sensor.

11. The device according to claim 1, wherein the at least one periodically modulated bias voltage modulation has a frequency of 50 Hz or 60 Hz.

* * * * *